(12) United States Patent
Wong et al.

(10) Patent No.: US 9,230,674 B1
(45) Date of Patent: Jan. 5, 2016

(54) NON-VOLATILE MEMORY WITH NEGATIVE BIAS

(71) Applicant: Synopsys, Inc., Mountain View, CA (US)

(72) Inventors: Yanyi Liu Wong, Bellevue, WA (US); Agustinus Sutandi, Issaquah, WA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/521,210

(22) Filed: Oct. 22, 2014

(51) Int. Cl.
| | | |
|---|---|---|
| G11C 16/04 | (2006.01) |
| G11C 16/26 | (2006.01) |
| G11C 16/24 | (2006.01) |
| G11C 16/10 | (2006.01) |
| G11C 16/12 | (2006.01) |
| G11C 16/30 | (2006.01) |
| G11C 16/08 | (2006.01) |
| G11C 7/18 | (2006.01) |

(52) U.S. Cl.
CPC ............ *G11C 16/26* (2013.01); *G11C 16/0483* (2013.01); *G11C 16/08* (2013.01); *G11C 16/10* (2013.01); *G11C 16/12* (2013.01); *G11C 16/24* (2013.01); *G11C 16/30* (2013.01); *G11C 7/18* (2013.01)

(58) Field of Classification Search
CPC ........ G11C 16/10; G11C 16/08; G11C 16/12; G11C 16/30; G11C 16/0483; G11C 7/18
USPC ........... 365/185.13, 185.05, 185.18, 189.011, 365/233.1
See application file for complete search history.

(56) References Cited

U.S. PATENT DOCUMENTS

| | | | | |
|---|---|---|---|---|
| 7,245,528 B2 * | 7/2007 | Shibata | ............. | G11C 11/5628 365/185.03 |
| 8,179,719 B1 * | 5/2012 | Yang | ........................ | G11C 8/10 365/185.03 |
| 8,254,180 B2 * | 8/2012 | Hoei | ...................... | G11C 5/063 365/185.17 |
| 8,289,771 B2 * | 10/2012 | Tseng | ................ | G11C 11/5628 365/185.02 |
| 8,614,923 B2 | 12/2013 | Macerola et al. | | |
| 8,737,136 B2 * | 5/2014 | Cometti | ................ | G11C 16/10 365/185.18 |

* cited by examiner

*Primary Examiner* — Pho M Luu
(74) *Attorney, Agent, or Firm* — Fenwick & West LLP

(57) ABSTRACT

A memory system with improved power consumption and operation speed. A memory system performs a data read operation in a low power read mode to improve operation speed and reduce power consumption by biasing bit cells in the memory system at a negative voltage. The use of the negative voltage minimizes changing of voltages of the bit cells. Additionally, the memory system performs data read operation in a margin read mode to improve accuracy of the reading by biasing the bit cells at a positive voltage.

22 Claims, 5 Drawing Sheets

NON-VOLATILE MEMORY WITH NEGATIVE BIAS

BACKGROUND

1. Field of Art

The disclosure generally relates to electronic circuit design, and more specifically to configurations for efficient memory circuits and operations.

2. Description of the Related Art

Memory devices are electronic devices arranged to store data. Among various types of memory devices, demand for embedded nonvolatile memory (NVM) in integrated circuits has increased recently, because NVM can retain data even when power is inactivated. Desirable characteristics of embedded NVM include low cost, low power, high speed, and high reliability (data retention and program/erase cycling endurance).

During the data read operations of NVM, a conventional approach applies positive voltages to multiple bit cells in NVM for selecting and sensing the data stored in selected bit cells. However, applying positive voltages to multiple bit cells causes high power consumption and extends time to perform the data read operation. Also, applying positive voltages to multiple bit cells may lead to changes of charges stored in the multiple bit cells, thus altering the stored data unintentionally.

Therefore, there is a need for an improved concept providing an efficient solution to the problem of NVM architecture and operation, in a manner that reduces power consumption and improves speed when performing data read operations.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
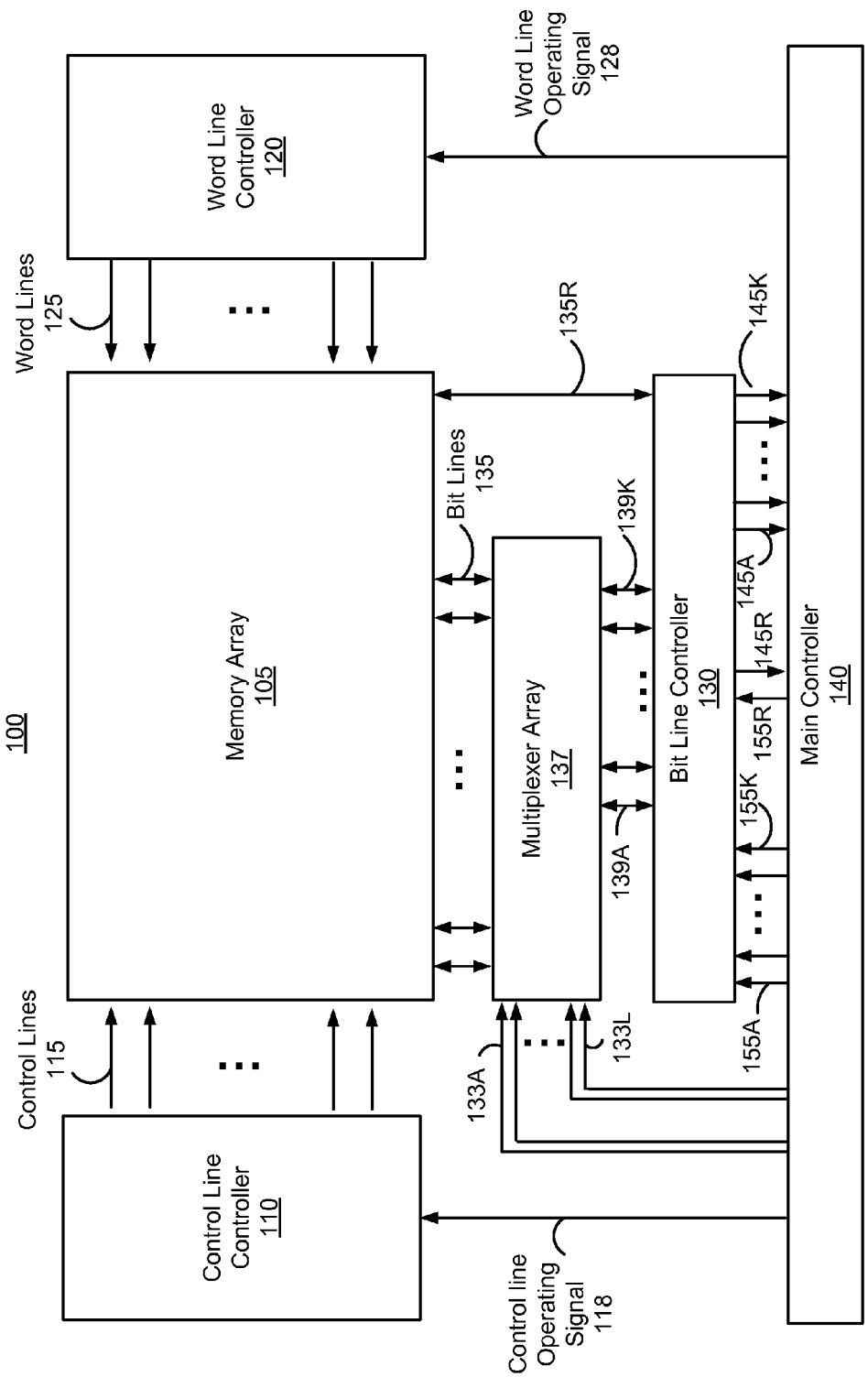
FIG. 1 illustrates one embodiment of a memory system.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

One embodiment of disclosed configurations includes a memory system (and method) for improving operation speed and power efficiency for reading data (e.g., content or logical state). One example configuration of a memory system performs a data read operation in a low power read mode to achieve low power consumption and fast operation speed by biasing bit cells in the memory system at a negative voltage. Additionally, the memory system performs a data read operation in a margin read mode to improve accuracy of the reading by biasing the bit cells at a positive voltage. Preferably, margin read mode is employed after erasing or programming the bit cells to determine if the stored charges in the bit cells have reached the level within a desirable (or predetermined) range.

Biasing herein refers to guiding a voltage of a terminal of a component. Biasing is different than supplying (or providing) a voltage to a terminal of a component in that, a terminal supplied (or provided) with a voltage is fixed or relatively unchanged, whereas a terminal biased at a voltage may be changed or varied based on other voltage or current applied to the terminal.

Example Nonvolatile Memory System with Negative Bias

Figure (FIG.) 1 is a block diagram illustrating a memory system 100, according to one embodiment. The memory system 100 includes a non-volatile memory (NVM) array (or memory array) 105, a control line controller 110, a word line controller 120, a bit line controller 130, and a main controller 140. The memory array 105 includes a plurality of bit cells to store data. In one implementation, a multiplexer array 137 is coupled between the bit line controller 130 and the memory array 105. Preferably, the memory system 100 is implemented in an integrated circuit. Together, these components perform data read and write operations on the memory array 105.

The main controller 140 coordinates the operation of the control line controller 110, the word line controller 120, and the bit line controller 130 for performing the data write operation and the data read operation. One aspect of performing the data read/write operation involves selecting a bit cell from the plurality of bit cells in the memory array 105 and providing appropriate voltages to bit cells according to the selection of the bit cell. A selected bit cell to perform the data read/write operation is determined by coordinating the selections from the control line controller 110, the word line controller 120, and the bit line controller 130. In one aspect, the bit cell is selected by matching selections from the control line controller 110, the word line controller 120, and the bit line controller 130. Hence, the main controller 140 operates the control line controller 110, the word line controller 120, and the bit line controller 130 to select a selected bit cell from a plurality of bit cells in the memory array 105.

In one approach, the control line controller 110 selects bit cells from the plurality of bit cells in one direction (herein referred to as a "row direction"), depending on the operation of the memory system 100. The main controller 140 provides a control line operating signal 118 to the control line controller 110 for selecting a control line 115 coupled to bit cells in the row. According to the control line operating signal 118, the control line controller 110 applies appropriate voltages to control lines 115 for performing the data read/write operation.

In one approach, the word line controller 120 selects bit cells from the plurality of bit cells in the row direction. The main controller 140 provides a word line operating signal 128 to the word line controller 120 for selecting a word line 125 associated with the selected control line 115 to provide power to the bit cells coupled to the selected word line 125. In one approach, the selected word line 125 is coupled to a portion of bit cells coupled to the selected control line 115 in the row. In one example, the word line controller 120 selects a word line 125 that is coupled to 1024 bit cells in a row coupled to a selected control line 115. Alternatively, a selection of the word line 125 is omitted, and all word lines 125 are supplied with the same voltage level. According to the word line operating signal 128, the word line controller 120 applies appropriate voltages to word lines 125.

The bit line controller 130 senses data stored in bit cells in another direction (herein referred to as a "column direction"). The main controller 140 controls the bit line controller 130 for biasing and sensing a selected bit cell from the bit cells in a row selected by the control line controller 110. The main controller 140 generates bias select signals 155A, 155B . . . 155K (generally herein referred to as a "bias select signal 155") for the bit line controller 130 to bias a bit line 135 associated with a selected bit cell. Additionally, the main controller 140 receives sense signals 145A, 145B . . . 145K (generally herein referred to as a "sense signal 145") from the bit line controller 130 for determining data stored in the selected NVM bit cell. According to the bias select signal 155, the bit line controller 130 biases bit lines 135 at appropriate voltages. For the data read operation, the bit line controller 130 senses a voltage of the selected bit line 135 according to the bias select signal 155. Based on the sensed voltage of the selected bit line 135, the bit line controller 130 generates the sense signal 145 for reading the data stored in the memory array 105. In one approach, the main controller 140 provides a reference select signal 155R to a bit line controller 130 and receives a reference signal 145R from the bit line controller 130 for determining data stored in a reference bit cell.

In one implementation, the multiplexer array 137 is structured between the memory array 105 and the bit line controller 130 for multiplexing the bit lines 135. The multiplexer array 137 is coupled to the bit line controller 130 through multiplexed bit lines 139A, 139B . . . 139K (generally herein referred to as a "multiplexed bit line 139"). In addition, the multiplexer array 137 is coupled to the memory array 105 through bit lines 135. In one aspect, the multiplexer array 137 includes a number, e.g., L (L comprising an integer value), of multiplexers, and each multiplexer is controlled by a corresponding bit select signals 133A, 133B . . . 133L (generally herein referred to as a "bit select signal 133") (A comprising a first integer value and L and some last (or outer) integer value) from the main controller 140 respectively. Each multiplexer is coupled to its corresponding multiplexed bit line 139 and a group of bit lines 135 coupled to the selected word line 125.

Figure 2:
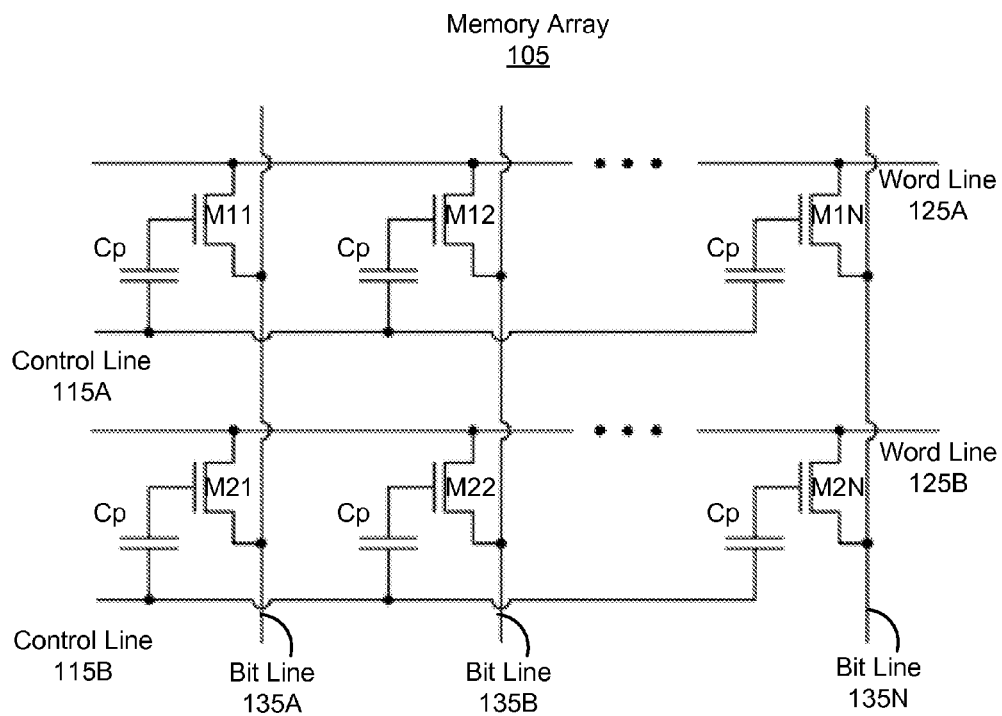
FIG. 2 illustrates one implementation of a non-volatile memory array of the memory system.

FIG. 2 illustrates one example embodiment of a portion of the non-volatile memory array 105 of the memory system 100. The memory array 105 includes bit cells formed by transistors M11, M12 . . . M2N, control lines 115A, 115B (herein referred to as a "control line 115"), word lines 125A, 125B (herein referred to as a "word line 125"), and bit lines 135A, 135B . . . 135N (herein referred to as a "bit line 135") (A comprising a first integer value and N comprising some outer integer value). In one implementation, each bit cell includes a transistor coupled to a control line 115, word line 125, and bit line 135. Preferably, the transistor is an n-channel MOSFET (herein referred to as an "NMOS transistor"), where a gate terminal is coupled to the control line 115, a drain terminal is coupled to the word line 125, and the source terminal is coupled to the bit line 135. For a nonvolatile memory, each bit cell may also include a capacitor Cp coupled between the floating gate and the control line 115. Based on voltages applied or biased to the bit cells through the control lines 115, word lines 125, and bit lines 135, charges may be stored on floating gates, or removed to reset the bit cells.

In one aspect, an NMOS transistor in the bit cell is enhanced with a drain junction having dopant concentrations in the lightly-doped-drain (LDD) region. As a result, higher channel-hot-electron-injection (CHEI) efficiency is achieved to deposit electron charges on the floating gates to represent a programmed state.

In one approach, one logical state of a bit cell is represented by storing (i.e., programming) charges on floating gate of the bit cell, and another logical state of the bit cell is represented by removing (i.e., erasing) charges on the floating gate of the bit cell. To erase a bit cell (e.g., set it to logic 0), charges on the floating gate of a transistor in the bit cell are removed such that the gate voltage (i.e., voltage at the gate terminal of a transistor) is higher than a reference voltage (herein also referred to as "Vref") and within a certain voltage range. Conversely, to program a bit cell (e.g., set it to logic 1), charges on the floating gate of the bit cell are deposited such that the gate voltage is lower than Vref and within another certain voltage range. For example, FN tunneling effect may be used to erase bit cells and channel hot electron injection effect may be used to program bit cells by applying high voltages or high currents to the NMOS transistors properly.

As described with respect to FIG. 1, the main controller 140 coordinates the operation of the memory array 105 by controlling the control line controller 110, the word line controller 120, and the bit line controller 130 through the control line operating signal 118, the word line operating signal 128, and the bias select signal 155, respectively.

In one approach, the memory system 100 is operable in two modes: a low power read mode and a margin read mode. The low power read mode is employed for saving power consumption and improving operation speed, and the margin read mode is employed for improving accuracy of the reading. Preferably, low power read mode is employed for normal memory read operations, whereas margin read mode is employed for determining whether the stored charges have reached desirable (or predetermined) ranges after programming or erasing NVM bit cells.

In one embodiment, for performing the data read operation in the low power read mode, the main controller 140 configures the control line controller 110 to provide a first high control line voltage (e.g., 5V) to a control line 115 coupled to a selected bit cells in a row, and a low control line voltage (e.g., 0V) to unselected bit cells in other rows. In addition, the main controller 140 configures the word line controller 120 to provide a low word line voltage (e.g., 0V) to all bit cells. Hence, a selection of the word line 125 is omitted. Additionally, the main controller 140 configures the bit line controller 130 to bias the bit line 135 coupled to selected bit cells in a column at a negative bit line voltage (e.g., between −0.7V and −0.05V, preferably −0.3V). Also, the main controller 140 configures the bit line controller 130 to bias other bit lines 135 coupled to unselected bit cells in other columns at an initial bit line voltage (e.g., 0V).

Accordingly, a transistor in the selected bit cell conducts and changes the voltage of the bit line 135 coupled to the selected bit cell. In contrast, a transistor in the unselected bit cell do not conduct, hence the voltages of the bit lines 135 coupled to the unselected bit cells remain at a relatively constant level. For example, a voltage of a source terminal of an NMOS transistor of the selected bit cell rises to a voltage level substantially equal to the voltage level of a drain terminal of the NMOS transistor of the selected bit cell. Based on the data stored in the selected bit cell, the level of conduction of the NMOS transistor changes. For example, if the selected bit cell is programmed, then the NMOS transistor's conductivity is lower, therefore the voltage of the bit line 135 increases slower than the referenced bit line. Conversely, if the selected bit cell is not programmed (i.e., erased), then the NMOS transistor's conductivity is higher, therefore the voltage of the bit line 135 increases faster than the referenced bit line.

Assume for an example, if an NMOS transistor M21 is to be selected for a data read operation in the low power read mode. In this case, the main controller 140 selects the control line 115B, word line 125B and bit line 135A. Hence, the control line 115B is supplied with the first high control line voltage (e.g., 5V), and the selected bit line 135A is biased at the negative bit line voltage (e.g., between –0.7V and –0.05V, and preferably –0.3V), when the control line 115A is supplied with the low control line voltage (e.g., 0V), each word line 125 is supplied with the low word line voltage (e.g., 0V), and the unselected bit lines 135B . . . 135N are biased at the initial bit line voltage (e.g., 0V).

An operational principle of the memory system 100 in the margin read mode is similar to the operation in the low power read mode. In one embodiment, for performing the data read operation in the margin read mode, the main controller 140 configures the control line controller 110 to provide a second high control line voltage (e.g., 7V) to the control line 115 coupled to a selected bit cells in a row and the low control line voltage (e.g., 0V) to unselected control lines 115 coupled to unselected bit cells in other rows. Preferably, the second high control line voltage is higher than the first high control line voltage. In addition, the main controller 140 configures the word line controller 120 to provide a high word line voltage (e.g., between 0.5V and 5.0V, and preferably 1.8V) to a selected word line 125 coupled to the selected bit cells in the row, and the low word line voltage (e.g., 0V) to unselected word lines coupled to the unselected bit cells in other rows. Additionally, the main controller 140 configures the bit line controller 130 to bias the selected bit line 135 coupled to selected bit cells in a column at the initial bit line voltage (e.g., 0V), and unselected bit lines 135 coupled to unselected bit cells in other columns at a positive bit line voltage (e.g., between 0.5V and 5.0V, and preferably 1.8V). Preferably, the second high control line voltage is higher than the first high control line voltage, and the high word line voltage is higher than the low word line voltage. In addition, the positive bit line voltage is higher than the initial bit line voltage, and the initial bit line voltage is higher than the negative bit line voltage.

Assume for another example, if an NMOS transistor M21 is to be selected for a data read operation in the margin read mode, the control line 115B is supplied with the second high control line voltage (e.g., 7V), the word line 125B is supplied with the high word line voltage (e.g., between 0.5V and 5.0V, and preferably 1.8V) and the selected bit line 135A is biased at the initial bit line voltage (e.g., 0V), when the control line 115A is supplied with the low control line voltage (e.g., 0V), the word line 125A is supplied with the low word line voltage (e.g., 0V), and the unselected bit lines 135B . . . 135N are biased at the positive bit line voltage (e.g., between 0.5V and 5.0V, and preferably 1.8V).

In one implementation, an erase line (not shown) is coupled to each floating gate, to perform an erase operation (i.e., remove charges stored in the floating gate). The erase line is independent of row and column selection, and a common signal is applied to the erase line coupled to floating gates of a group of bit cells (herein referred to as "a page"). For example, a group of bit cells includes 4096 bit cells. Hence, the erase operation is performed per page, while read and write operations can be done per bit or per word (e.g., 32 bits).

The memory system 100 enables savings of power consumption by using a negative voltage in the low power read mode. Without the use of the negative voltage, voltages applied to the memory array 105 may be similar to the voltages supplied in the margin read mode. Hence, selecting a bit cell may involve changing the voltage at the word line 125 from 0V to 1.8V. Furthermore, selecting the bit cell may involve changing voltages at unselected bit lines 135 from 0V to 1.8V, which results in a large power consumption. In contrast, in the low power read mode, the voltage at the word line 125 remains at the word line low voltage (e.g., 0V) regardless of whether the word lines 125 are selected or not. In addition, voltages at the unselected bit lines 135 remain at the initial bit line voltage (e.g., 0V), and only the selected bit lines 135 are biased at the negative bit line voltage in the low power read mode. Therefore, changing in voltages of word lines 125 and bit lines 135 are reduced in the low power read mode. As a result, the power consumption is reduced and the data read operation speed is improved.

After a bit cell is erased or programmed, a margin read mode is used to ensure that the floating gate voltage has indeed reached the desirable voltage range. By applying higher voltages to control lines 115, word lines 125 and the bit lines 135, the margin read mode improves accuracy in the reading and immunity against electron trap-up/de-trapping issues. In terms of accuracy, higher Vds of the NMOS transistor (i.e., the voltage difference between the drain terminal of the transistor and the source terminal of the transistor) allows the NMOS transistor to operate in the saturation region. The NMOS transistor is less sensitive to Vds mismatch in the saturation region than in the linear region, therefore accuracy of the reading improves in the margin read mode. Also, the higher accuracy in the margin read mode can support wider voltage differences between erased states and programmed states due to higher accuracy, making the NVM more immune to the floating gate voltage shifts due to electron trap-up and de-trapping phenomenon.

Figure 3:
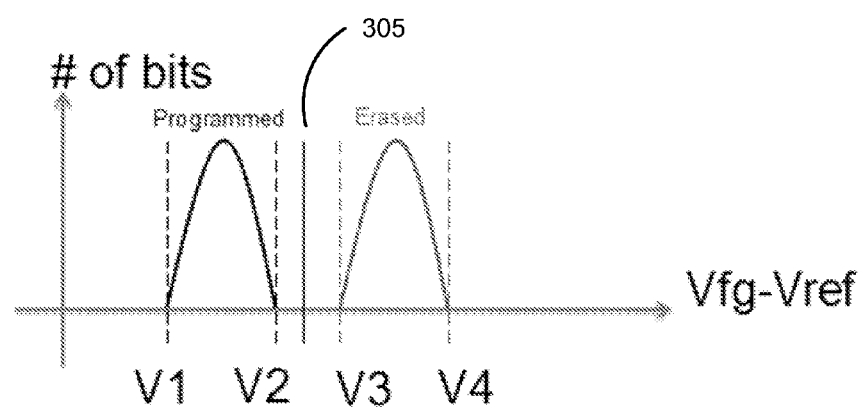
FIG. 3 illustrates example voltage distributions for programming the non-volatile memory array.

FIG. 3 depicts the example voltage ranges for logical 0 and logical 1 floating gate voltages (Vfg). The solid vertical line 305 between V2 and V3 denotes 0V, which means Vfg is equal to Vref (such that Vfg–Vref=0). For erased bit cells, distribution of Vfg between V3+Vref and V4+Vref may have a bell-shaped curve to the right of the solid line 305, where V3 and V4 are positive values. For programmed bit cells, distribution of Vfg between V1+Vref and V2+Vref may have another bell-shaped curve to the left of the solid line 305, where V1 and V2 are negative values. For example, V1 is set to –0.8V, V2 is set to –0.3V, V3 is set to 0.3V, and V4 is set to 0.8V.

Figure 4:
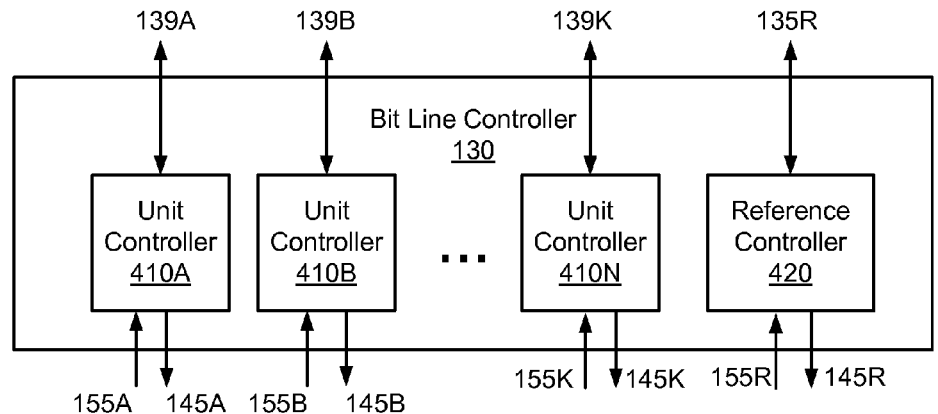
FIG. 4 illustrates one implementation of a bit line controller of the non-volatile memory system.

FIG. 4 illustrates one implementation of the bit line controller 130 of the memory system 100 to bias bit lines 135 and sense charges stored on a selected bit cell. In one approach, the bit line controller 130 includes unit controllers 410A, 410B . . . 410N (generally herein referred to as a "unit controller 410"). Each unit controller 410 is coupled to its associated bit line 135 and its associated bias select signal 155. In one approach, each unit controller 410 is coupled to an associated bit line 135 through an associated multiplexed bit line 139. Based on the bias select signal 155, the unit controller 410 biases the associated bit line 135 that the unit controller 410 is coupled to. For the data read operation, the unit controller 410 generates a sense signal 145 for the main controller 140 based on the data stored on the bit cell coupled to a selected control line 115, a selected word line 125, and the associated bit line 135 of the unit controller 410.

Assuming for an example, the memory array 105 includes 1024 bit lines 135, the multiplexer array 137 includes 32 multiplexers, and the bit line controller 130 includes 32 unit controllers 410. Hence, each multiplexer (herein also referred to as "MUX") is configured to select one out of 32 bit lines 135 from the 1024 bit lines 135 to couple to the unit controller 410. For example, MUX_0 selects one bit line 135 from BL_0 to BL_31, for connecting to the unit controller 410A, and MUX_1 selects one bit line 135 from BL_32 to BL_63, for connecting to the unit controller 410B, and so on.

In one implementation, the bit line controller 130 may also include a reference controller 420 for providing a reference to the main controller 140, when performing a data read operation. In one approach, the reference controller 420 receives the reference select signal 155R from the main controller 140, to enable or disable the operation of the reference controller 420 or configure the settings within the reference controller 420. The reference controller 420 is coupled to a reference bit line 135R from the memory array 105. In one approach, the reference bit line 135R is a dedicated bit line in the memory array 105. Capacitors Cp in the bit cells coupled to the reference bit line 135R are charged such that each gate terminal of the NMOS transistor in the bit cell coupled to the reference bit line 135R has a voltage level of Vref. Hence, the reference controller 420 generates a reference signal 145R according to the voltage level Vref. The main controller 140 compares the reference signal 145R with the sense signal 145 and determines content stored in a selected bit cell.

In one example implementation, a gate terminal of the NMOS transistor in the reference bit cell is not floating. Preferably, if the same reference bit cells are to be used in both low power read mode and margin read mode, conventional NMOS transistors may be used in reference bit cells. The conventional NMOS transistors in reference bit cells can be biased by capacitive network or resistive network capable of delivering different voltages to the gates depending on the read modes.

In case enhanced NMOS transistors are used for bit cells, and conventional NMOS transistors are used for reference bit cells, preferably, Vref is recommended to be Vthn−2Vthnom, where Vthnom is the threshold voltage of a conventional NMOS transistor and Vthn is the threshold voltage of an NMOS transistor in the bit cell. Hence, if Vthn is equal to Vthnom, the recommended Vref is −Vthn.

Figure 5:
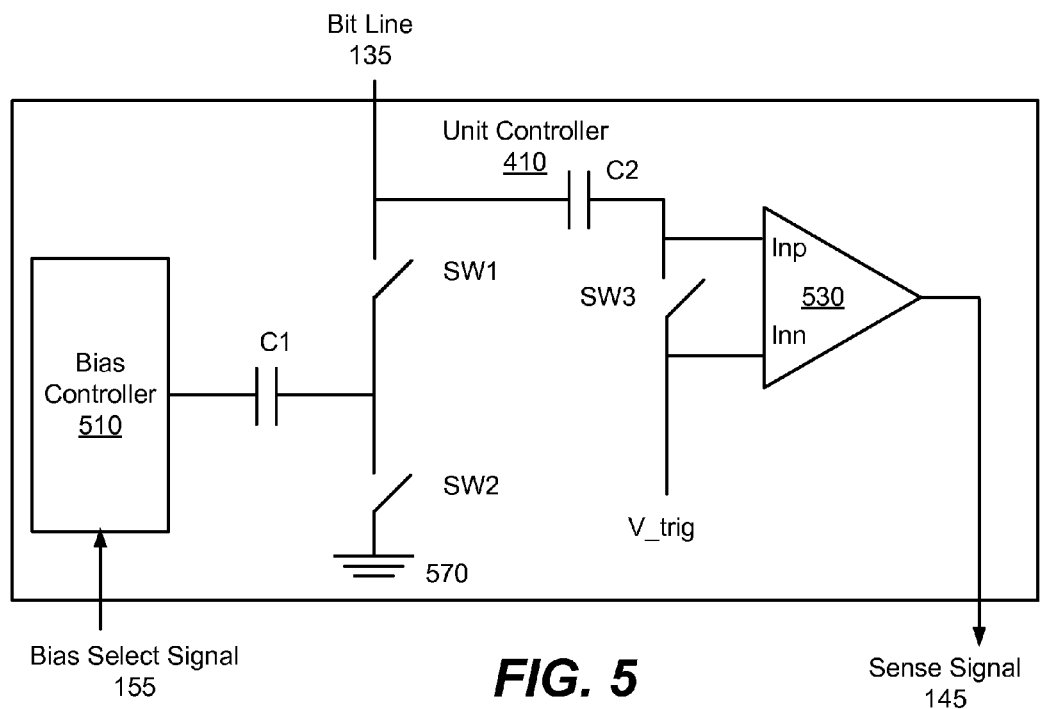
FIG. 5 illustrates an example circuit of a unit controller of the bit line controller to generate negative voltages.

FIG. 5 illustrates an example circuit of a unit controller 410 of the bit line controller 130 according to one embodiment. In one implementation, the unit controller 410 includes a bias controller 510, a first capacitor C1, a second capacitor C2, three switches sw1, sw2, sw3 and a sense amplifier 530. The switches may be operated (opened and closed) based on controls from the main controller 140. The bias controller 510, the first capacitor C1, the switches sw1 and sw2 operate together to bias a voltage level of the bit line 135 appropriately. The second capacitor, the switch sw3, and the sense amplifier 530 operate together to sense data stored in a selected bit cell. Together, these components perform the data read operation.

In one embodiment, the bit line 135 is coupled to an initial bit line voltage 570 (e.g., ground level or 0V) through switches sw1 and sw2. For example, one end of the switch sw1 is connected to the bit line 135, and another end of the switch sw1 is connected to one end of the second switch sw2. In one approach, the unit controller 410 is coupled to the bit line 135 through a multiplexed bit line 139. Also, another end of the switch sw2 is connected to the initial bit line voltage 570. When the switches sw1 and sw2 are closed, the bit line 135 is connected to the initial bit line voltage 570. When any of the switches sw1 and sw2 is opened, the bit line 135 becomes disconnected from the initial bit line voltage 570.

The bit line 135 is coupled to the bias controller 510 through the first capacitor C1 and the switch sw1 for biasing the bit line 135. In one implementation, one end of the first capacitor C1 is coupled to the bias controller 510, and another end of the first capacitor C1 is coupled between the switches sw1 and sw2. In one aspect, when sw1 and sw2 are closed and the bit line 135 is connected to the initial bit line voltage 570 (e.g., ground level or 0V), the bias controller 510 outputs a voltage level of VDD (e.g., 1.8V) responsive to receiving a bias select signal 155 with a high bias select voltage (e.g., 1.8V), such that charge amount of VDD*C1 is stored in the first capacitor C1. Additionally, when the switch sw1 is closed and the switch sw2 is opened, the bias controller 510 outputs 0V responsive to receiving the bias select signal 155 with a low bias select voltage (e.g., 0V) to discharge the charge stored in the first capacitor C1, thereby biasing the bit line 135 at a negative bit line voltage (−0.3V) through the first capacitor C1.

The bit line 135 is also coupled to the sense amplifier 530 through the second capacitor C2 for sensing the data stored in the selected bit cell. In one implementation, one end of the second capacitor C2 is coupled to the bit line 135 and the switch sw1. Also, another end of the second capacitor C2 is coupled to a positive input port (Inp) of the sense amplifier 530. A negative input port (Inn) of the sense amplifier 530 is coupled to a sense amplifier trigger voltage (herein also referred to as "V_trig"), and the switch SW3 is coupled between the positive input port (Inp) and the negative input port (Inn) of the sense amplifier 530. In this configuration, when the switch sw3 is closed, a voltage level at the positive input port (Inp) of the sense amplifier 530 and a voltage level at the negative input port (Inn) of the sense amplifier 530 are equal to V_trig (e.g., 0.9V). When the switch sw3 is opened, the voltage at the positive input port (Inp) of the sense amplifier 530 changes based on the data stored in the selected bit cell coupled to the bit line 135. However, the voltage at the negative input port (Inn) of the sense amplifier 530 is at V_trig, thereby causing the sense amplifier 530 to generate a sense signal 145 according to the voltage difference at the positive input port (Inp) and the negative voltage input port (Inn). Based on the sense signal 145, the main controller 140 determines a state of data stored in the selected bit cell.

In one embodiment, time to generate the sense signal 145 is compared with time to generate the reference signal 145R to determine the program state stored in the bit cell. For example, in case the bit cell is programmed, the time to generate the sense signal 145 is slower than the time to generate the reference signal 145R.

The unit controller 410 performs the data read operation in a low power read mode through four phases as shown in Table 1. In phase 1, the unit controller 410 is in the quiescent state. In phase 2, the unit controller 410 disconnects the bit line 135 from the initial bit line voltage 570. In phase 3, the unit controller 410 biases the bit line 135 at the bit line negative voltage. In phase 4, the unit controller 410 senses the data stored in the sense amplifier 530. The values of the voltages are listed as an example, and may be modified to have different values to achieve similar results.

TABLE 1

Timing operation of the example unit controller 410 in the low power read mode.

|  | phase1 | phase2 | phase3 | phase4 |
| --- | --- | --- | --- | --- |
| sw1 | Closed | Closed | Closed | Open |
| sw2 | Closed | Open | Open | Open |
| sw3 | Closed | Closed | Closed | Open |
| Bias Select 155 (Selected) | 1.8 V | 1.8 V | 0 V | 0 V |
| Bit Line 135 (Selected) | 0 V | 0 V | −0.3 V | increase from −0.3 V due to bitline current |

In phase 1, the three switches sw1, sw2, sw3 are closed. In addition, the voltage of the bias select signal 155 is at a high bias select voltage level (e.g., 1.8V) and the bit line 135 is supplied with an initial bit line voltage level (e.g., 0V or ground level). In phase 2, the switch sw2 is opened when the switches sw1 and sw3 remain closed, and the bit line 135 becomes floating. In phase 3, the bias select signal 155 is pulled down to a low bias select voltage level (e.g., 0v), which causes the bit line 135 to be biased at a negative bit line voltage (e.g., −0.3v). When the switch sw3 is closed, a voltage level at a positive input port (Inp) of the sense amplifier 530 and a voltage level at a negative input port (Inn) of the sense amplifier 530 are equal to V_trig (e.g., 0.9V). In phase 4, both sw1 and sw3 are opened, to enable sensing the data stored in the selected bit cell. In one approach, the unit controllers 410 are provided with the same bias select signal 155, hence the main controller 140 may provide one bias select signal 155 to the unit controller 410. Alternatively, each unit controller 410 is provided with its associated bias select signal 155.

The unit controller 410 performs the data read operation in the margin read mode through two phases. For example, the switches sw1, sw2, and sw3 are operated as listed in Table 2 through two phases.

TABLE 2

Timing operation of the example unit controller 410 in the margin read mode.

|  | phase1 | phase2 |
| --- | --- | --- |
| sw1 | Closed | Open |
| sw2 | Closed | Closed |
| sw3 | Closed | Open |
| Bias Select 155 (Selected) | 1.8 V | 1.8 V |
| Bit Line 135 (Selected) | 0 V | increase from 0 V due to bitline current |

For the unit controller 410 to operate in the margin read mode, the unit controller 410 may utilize an additional bias controller 510. In one implementation, the additional bias controller 510 is coupled to one end of the capacitor C1 and another end of the capacitor C1 is coupled to the bit line 135 for biasing the bit line 135 at the positive voltage. The main controller 140 may provide the bias select signal 155 to the unit controller 410 with appropriate voltages listed in Table 2 for the additional bias controller 510 of the unit controller 410 to bias the bit line 135 at a positive voltage for the margin read mode.

Beneficially, the disclosed configuration of the memory system 100 achieves low power consumption, fast data read operation speed and high accuracy for performing the data read operation. The memory system 100 is operable in the low power read mode in a manner that reduces power consumption and improves operation speed by using a negative voltage. The memory system 100 is also operable in the margin read mode to achieve high accuracy in the reading by applying positive voltages.

Method of Performing Low Power Read Operation

Figure 6:
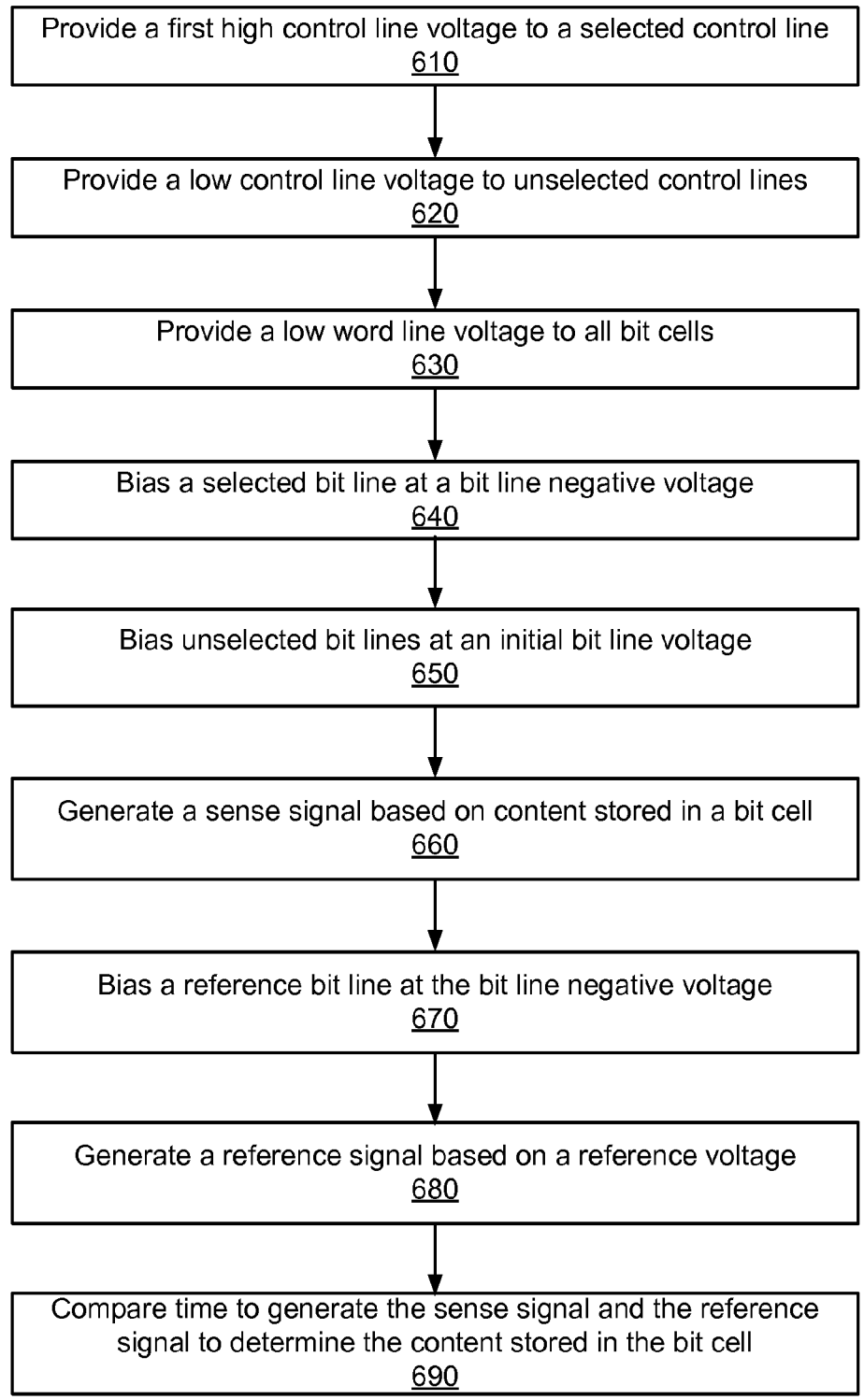
FIG. 6 illustrates a flow chart for reading data stored in the non-volatile memory system using negative voltages, according to one embodiment.

FIG. 6 is a flow chart illustrating a process of performing a low power read operation of the memory system 100. The process is performed to read content stored in a selected bit cell. Other embodiments can perform the steps of FIG. 6 in different orders. Moreover, other embodiments can include different and/or additional steps than the ones described here. The steps may be performed on a hardware implemented memory system 100. Alternatively, the steps may be stored as an instruction in a computer readable medium, and applied on a representation (e.g., netlist, Verilog, or VHDL) of the memory system 100 during schematic, logic, and/or layout design.

In one embodiment, a control line 115 is selected by providing 610 a first high control line voltage (e.g., 5V) to a selected control line 115. Bit cells in a row direction are coupled to the selected control line 115, when the bit cells in the row direction include the selected bit cell. Unselected control lines 115 are provided 620 with a low control line voltage (e.g., 0V).

In addition, word lines 125 are provided 630 with a low word line voltage (e.g., 0V). In one approach, the low word line voltage and the low control line voltage are substantially equal.

Moreover, a bit line 135 from the plurality of bit lines 135 is selected by biasing 640 the selected bit line 135 at a bit line negative voltage (e.g., −0.3V). Unselected bit lines 135 are biased 650 at an initial bit line voltage (e.g., 0V). In one approach, the initial bit line voltage is substantially equal to the low control line voltage or the low word line voltage. The selected bit line 135 is coupled to bit cells in a column direction, and the selected bit cell is coupled to both the selected bit line 135 and the selected control line 115.

Additionally, a sense signal 145 is generated 660 based on content stored in the selected bit cell. The sense signal 145 is used to determine the content (logical state) stored in the selected bit cell. In one approach, a reference bit line 135R coupled to bit cells in another column is biased 670 at the negative bit line voltage. Preferably, the bit cells in another column are programmed with a reference voltage Vref. Hence, the reference signal 145R is generated 680 based on the reference voltage programmed on the bit cells coupled to the reference bit line 135R. Furthermore, time to generate the sense signal 145 and the reference signal 145R are compared 690 to determine the content stored in the selected bit cell.

Computing Machine Architecture

Figure 7:
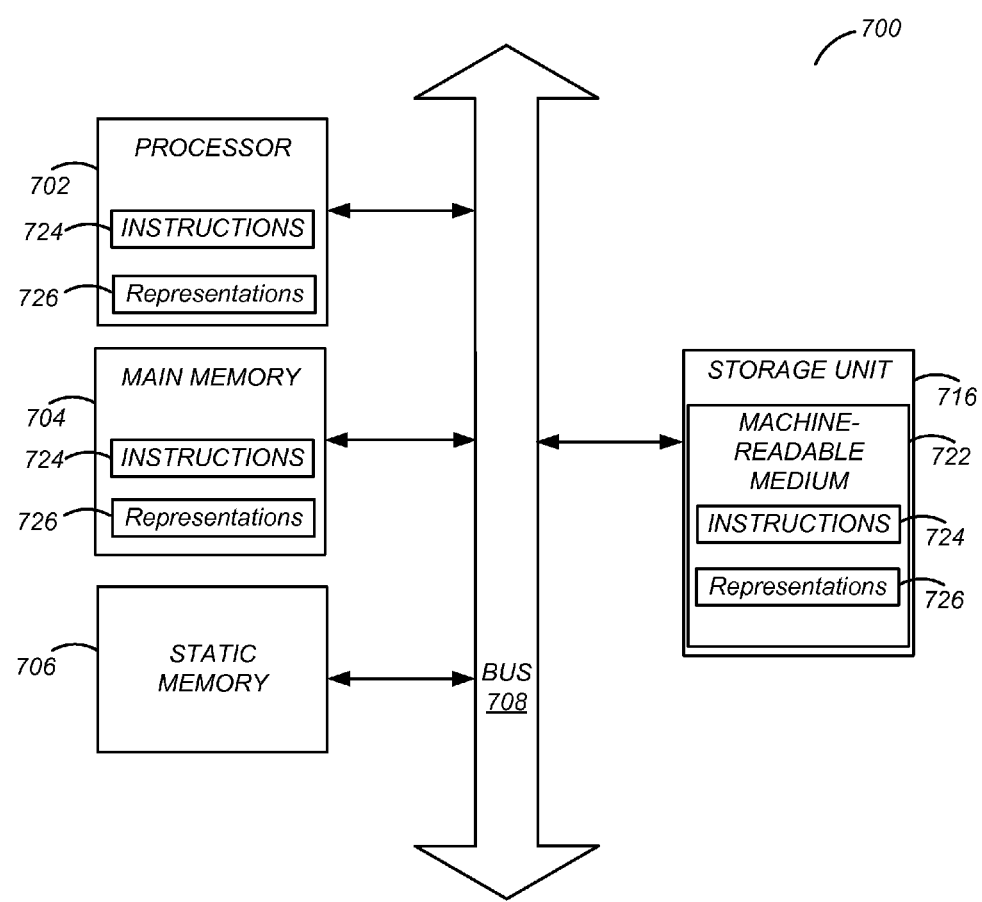
FIG. 7 illustrates one embodiment of components of an example machine able to read instructions or representations from a machine-readable medium and execute them in a processor (or controller).

FIG. (Figure) 7 is a block diagram illustrating components of an example machine able to read instructions from a machine-readable medium and execute them in a processor (or controller). Specifically, FIG. 7 shows a diagrammatic representation of a machine in the example form of a computer system 700 within which instructions 724 (e.g., software) for causing the machine to perform any one or more of the methodologies discussed herein may be executed. For example, the computer system 700 stores representations 726 of the memory system 100 disclosed above to be used in a process of integrated circuit design. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), or any machine capable of executing instructions 724 (sequential or otherwise) that specify actions to be taken by that machine. Further, while only a single machine is illustrated, the term "machine" shall also be taken to include any collection of machines that individually or jointly execute instructions 724 to perform any one or more of the methodologies discussed herein.

The example computer system 700 includes a processor 702 (e.g., a central processing unit (CPU), a graphics processing unit (GPU), a digital signal processor (DSP), one or more application specific integrated circuits (ASICs), a main memory 704, a static memory 706, and a storage unit 716 which are configured to communicate with each other via a bus 708. The storage unit 716 includes a machine-readable medium 722 on which is stored instructions 724 (e.g., software) and/or representations 726 embodying any one or more of the methodologies or functions described herein. The instructions 724 (e.g., software) and the representations 726 may also reside, completely or at least partially, within the main memory 704 or within the processor 702 (e.g., within a processor's cache memory) during execution thereof by the computer system 700, the main memory 704 and the processor 702 also constituting machine-readable media.

In one implementation, the representations 726 of the disclosed memory system 100 are stored in a computer readable medium 722 (storage) and employed in electronic design automation (EDA) software in the process of design of integrated circuits and systems. In one aspect, a pre-populated representation 726 of the memory system 100 disclosed herein is stored in a computer readable medium 722 (storage) in VHDL or Verilog code. The pre-populated representation of the memory system 100 may be used in schematic, input netlist or logic level design. Alternatively and additionally, another pre-populated representation 726 of the memory system 100 including physical positioning of circuit elements and routing (connection of the same) such as in GDSII are stored in the computer readable medium 722 (storage). Another pre-populated representation 726 of the memory system 100 may be used in physical layout implementation.

For example, the representation 726 of the memory system 100 includes representations of a plurality of bit cells structured in a row with a representation of a control line 115, a representation of a word line 125, and a representation of a plurality of bit lines 135. Each bit line 135 is associated with a corresponding bit cell from the plurality of bit cells. The control line 115 couples the word line 125 and a selected bit line 135 from the plurality of bit lines 135 to read a content in a bit cell associated with the selected bit line 135 responsive to the control line 115 supplied with a representation of a first control line voltage (e.g., 5V). The word line 125 may be applied with a representation of a low word line voltage (e.g., 0V). The control line 115 decouples the word line 125 and the plurality of bit lines 135 to not read contents in the plurality of bit cells responsive to the control line 115 supplied with a representation of a low control line voltage (e.g., 0V).

The representation 726 of the memory system 100 may also include a representation of a bit line controller 130 coupled to the plurality of bit lines 135. The selected bit line 135 from the plurality of bit lines 135 are biased at a representation of a negative bit line voltage (e.g., −0.3V) lower than the low control line voltage, to read the content in the bit cell associated with the selected bit line 135 in a low power read mode. Unselected bit lines 135 may be biased at an initial bit line voltage (e.g., 0V) higher than the negative bit line voltage. The initial bit line voltage may be substantially equal to the low control line voltage and the low word line voltage.

While machine-readable medium 722 is shown in an example embodiment to be a single medium, the term "machine-readable medium" should be taken to include a single medium or multiple media (e.g., a centralized or distributed database, or associated caches and servers) able to store instructions (e.g., instructions 724). The term "machine-readable medium" shall also be taken to include any medium that is capable of storing instructions (e.g., instructions 724) for execution by the machine and that cause the machine to perform any one or more of the methodologies disclosed herein. The term "machine-readable medium" includes, but not be limited to, data repositories in the form of solid-state memories, optical media, and magnetic media.

Additional Configuration Considerations

It is noted that although the configurations as disclosed are in the context of a data read operation, the negative voltage may be used to perform a data write operation in a non-volatile memory system. In addition, the principles disclosed can apply to other memory systems, sensors, or display devices having a plurality of bit cells in an array structure. Advantages of the disclosed configurations include utilizing a negative voltage to minimize changes in the voltages during the data read operation. Such usage of the negative voltage enables reduced power consumption and faster operation speed.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The various operations of example methods described herein, such as those performed by the compiler, may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). In addition, use of the "a" or "an" are employed to describe elements and components of the embodiments herein. This is done merely for convenience and to improve the clarity of this disclosure. This description should be read to include one or at least one and the singular also includes the plural unless it is obvious that it is meant otherwise.

Upon reading this disclosure, those of skill in the art will appreciate a method and system for improved operation speed and reducing power consumption by using a negative voltage through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-volatile memory system, comprising:
a plurality of bit cells structured in a row with a control line, a word line, and a plurality of bit lines, each bit line associated with a corresponding bit cell from the plurality of bit cells, the control line configured to:
couple the word line and a selected bit line from the plurality of bit lines to read a content in a bit cell associated with the selected bit line responsive to the control line supplied with a first voltage, and
decouple the word line and the plurality of bit lines to not read contents in the plurality of bit cells responsive to the control line supplied with a second voltage; and
a bit line controller coupled to the plurality of bit lines and to bias the selected bit line from the plurality of bit lines at a third voltage that is lower than the second voltage to read the content in the bit cell associated with the selected bit line in a first mode.

2. The non-volatile memory system of claim 1, wherein in the first mode the word line is supplied with the second voltage, and an unselected bit line from the plurality of bit lines is biased at a voltage substantially equal to the second voltage to not read a content in a bit cell associated with the unselected bit line in the first mode.

3. The non-volatile memory system of claim 2, wherein to read the content in the bit cell associated with the selected bit line in a second mode,
the word line is supplied with a fourth voltage higher than the second voltage,
the selected bit line from the plurality of bit lines is biased at a voltage substantially equal to the second voltage, and
the unselected bit line from the plurality of bit lines is biased at a voltage substantially equal to the fourth voltage to not read the content in the bit cell associated with the unselected bit line in the second mode.

4. The non-volatile memory system of claim 3, wherein the second voltage is substantially equal to 0V, the third voltage is between −0.7V and −0.05V, and the fourth voltage is between 5.0V and 0.5V.

5. The non-volatile memory system of claim 1, wherein the bit line controller comprises a bias controller configured to bias the selected bit line from the plurality of bit lines at the third voltage based on a bias select signal.

6. The non-volatile memory system of claim 1, wherein a voltage at the selected bit line changes according to the content in the bit cell associated with the selected bit line responsive to the control line coupling the word line and the selected bit line, and a time for the voltage at the selected bit line to reach a target level is compared with a predetermined time to determine the content in the bit cell associated with the selected bit line.

7. The non-volatile memory system of claim 6, wherein the bit line controller further comprises an amplifier to amplify the voltage at the selected bit line to compare the time for the voltage at the selected bit line to reach the target level with the predetermined time to determine the content in the bit cell associated with the selected bit line.

8. The non-volatile memory system of claim 1, wherein each of the plurality of bit cells in the row comprises a transistor, the control line coupled to gate terminals of the transistors, the word line coupled to drain terminals of the transistors, and each bit line coupled to a source terminal of a transistor in its associated bit cell.

9. The non-volatile memory system of claim 8, wherein each of the plurality of bit cells in the row further comprises a capacitor coupled between the control line and a gate terminal of the transistor in its bit cell, the capacitor storing charges according to the content.

10. A computer program product comprising a non-transitory computer readable storage medium storing a representation of a non-volatile memory system, the representation of the non-volatile memory system comprising:
    a plurality of bit cells structured in a row with a representation of a control line, a representation of a word line, and a representation of a plurality of bit lines, each bit line associated with a corresponding bit cell from the plurality of bit cells, the control line configured to:
        couple the word line and a selected bit line from the plurality of bit lines to read a content in a bit cell associated with the selected bit line responsive to the control line supplied with a representation of first voltage, and
        decouple the word line and the plurality of bit lines to not read contents in the plurality of bit cells responsive to the control line supplied with a representation of a second voltage; and
    a bit line controller coupled to the plurality of bit lines to bias the selected bit line from the plurality of bit lines at a representation of a third voltage that is lower than the second voltage to read the content in the bit cell associated with the selected bit line in a first mode.

11. The computer program product of claim 10, wherein the bit line controller comprises bias controller configured to bias the selected bit line from the plurality of bit lines at the third voltage based on a bias select signal.

12. The computer program product of claim 10, wherein each of the plurality of bit cells in the row comprises a representation of a transistor, the control line coupled to gate terminals of the transistors, the word line coupled to drain terminals of the transistors, and each bit line coupled to a source terminal of a transistor in its associated bit cell.

13. The computer program product of claim 12, wherein each of the plurality of bit cells in the row further comprises a representation of a capacitor coupled between the control line and a gate terminal of the transistor in its bit cell, the capacitor storing charges according to the content.

14. A method of reading a content stored in a non-volatile memory system comprised of a plurality of bit cells, the method comprising:
    providing a first voltage to a selected control line coupled to bit cells in a row;
    providing a second voltage to an unselected control line coupled to bit cells in another row from the plurality of bit cells;
    biasing a selected bit line coupled to bit cells in a column at a third voltage lower than the second voltage, the bit cells in the column comprising a bit cell coupled to the selected control line;
    biasing unselected bit lines coupled to bit cells in other columns at a voltage substantially equal to the second voltage; and
    generating a sense signal based on the content stored in the bit cell.

15. The method of claim 14, further comprising:
    comparing time to generate the sense signal and time to generate a reference signal to determine the content stored in the bit cell.

16. The method of claim 15, further comprising:
    biasing another bit line coupled to bit cells in another column at the third voltage, the bit cells in said another column programmed with a reference voltage; and
    generating the reference signal based on the reference voltage programmed in the bit cells in said another column.

17. A non-volatile memory, comprising:
    a plurality of bit cells structured in a row with a control line, a word line, and a plurality of bit lines, each bit line associated with a corresponding bit cell from the plurality of bit cells, the control line configured to:
        couple the word line and a selected bit line from the plurality of bit lines responsive to the control line supplied with a first voltage, the selected bit line (i) biased at a second voltage that is lower than a third voltage to read a content in a bit cell associated with the selected bit line in a first mode and (ii) biased at a voltage level substantially equal to the third voltage to determine whether charges stored in the bit cell associated with the selected bit line is within a predetermined range in a second mode, and
        decouple the word line and the plurality of bit lines to not read contents in the plurality of bit cells responsive to the control line supplied with the third voltage.

18. The non-volatile memory of claim 17, wherein in the first mode the word line is supplied with the third voltage, and an unselected bit line from the plurality of bit lines is biased at a voltage substantially equal to the third voltage to not read a content in a bit cell associated with the unselected bit line in the first mode.

19. The non-volatile memory of claim 18, wherein to read the content in the bit cell associated with the selected bit line in the second mode,
    the word line is supplied with a fourth voltage higher than the third voltage, and
    the unselected bit line from the plurality of bit lines is biased at a voltage substantially equal to the fourth voltage to not read the content in the bit cell associated with the unselected bit line in the second mode.

20. The non-volatile memory of claim 19, wherein the third voltage is substantially equal to 0V, the second voltage is between −0.7V and −0.05V, and the fourth voltage is between 5.0V and 0.5V.

21. The non-volatile memory of claim 20, wherein a voltage at the selected bit line changes according to the content in the bit cell associated with the selected bit line responsive to the control line coupling the word line and the selected bit line, and a time for the voltage at the selected bit line to reach a target level is compared with a predetermined time to determine the content in the bit cell associated with the selected bit line.

22. A computer program product comprising a non-transitory computer readable medium storing a representation of a non-volatile memory, the representation of the non-volatile memory comprising:
    a plurality of bit cells structured in a row with a representation of a control line, a representation of a word line, and a representation of a plurality of bit lines, each bit line associated with a corresponding bit cell from the plurality of bit cells, the control line configured to:
        couple the word line and a selected bit line from the plurality of bit lines responsive to the control line supplied with a representation of a first voltage, the selected bit line (i) biased at a representation of a second voltage that is lower than a representation of a third voltage to read a content in a bit cell associated with the selected bit line in a first mode and (ii) biased at a voltage level substantially equal to the third voltage to determine whether charges stored in the bit cell associated with the selected bit line is within a predetermined range in a second mode, and decouple the word line and the plurality of bit lines to not read contents in the plurality of bit cells responsive to the control line supplied with the third voltage.

* * * * *